United States Patent
Onishi et al.

(10) Patent No.: US 10,224,692 B2
(45) Date of Patent: Mar. 5, 2019

(54) SURFACE EMITTING LASER ELEMENT AND OPTICAL DEVICE

(71) Applicant: ROHM CO., LTD., Kyoto (JP)

(72) Inventors: Dai Onishi, Kyoto (JP); Masashi Yamamoto, Kyoto (JP); Daiju Takamizu, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/831,848

(22) Filed: Dec. 5, 2017

(65) Prior Publication Data

US 2018/0198255 A1 Jul. 12, 2018

(30) Foreign Application Priority Data

Jan. 12, 2017 (JP) .................. 2017-003332

(51) Int. Cl.
| | |
|---|---|
| *H01S 5/10* | (2006.01) |
| *H01S 5/22* | (2006.01) |
| *H01S 5/42* | (2006.01) |
| *H01S 5/022* | (2006.01) |
| *H01S 5/026* | (2006.01) |
| *H01S 5/042* | (2006.01) |
| *H01S 5/183* | (2006.01) |

(52) U.S. Cl.
CPC ........ *H01S 5/02228* (2013.01); *H01S 5/0262* (2013.01); *H01S 5/02276* (2013.01); *H01S 5/1071* (2013.01); *H01S 5/183* (2013.01); *H01S 5/18344* (2013.01); *H01S 5/2205* (2013.01); *H01S 5/0425* (2013.01); *H01S 5/18313* (2013.01); *H01S 5/423* (2013.01)

(58) Field of Classification Search
CPC ................. H01S 5/1071; H01S 5/1835; H01S 5/183–5/18397; H01S 5/18394
See application file for complete search history.

(56) References Cited

U.S. PATENT DOCUMENTS

| | | | | |
|---|---|---|---|---|
| 4,214,251 | A | * | 7/1980 | Schairer .................. H01L 33/20 257/522 |
| 5,345,462 | A | * | 9/1994 | Choquette ............. H01S 5/1835 372/45.01 |

(Continued)

FOREIGN PATENT DOCUMENTS

| | | | | |
|---|---|---|---|---|
| JP | 07254732 | A | * 10/1995 | ............. B82Y 20/00 |
| JP | 2008-028185 | | 2/2008 | |

(Continued)

*Primary Examiner* — Joshua King
(74) *Attorney, Agent, or Firm* — Hamre, Schumann, Mueller & Larson, P.C.

(57) ABSTRACT

A surface emitting laser element includes a first distribution Bragg reflector (DBR) layer having a first conductivity type; a second DBR layer having a second conductivity type opposite to the first conductivity type; an active layer located between the first DBR layer and the second DBR layer; an insulating layer formed over the second DBR layer; and a surface conductive layer formed over the insulating layer. In the surface emitting laser element, a first opening, which exposes the insulating layer and overlaps with the active layer when viewed in a thickness direction of the first DBR layer, is formed in the surface conductive layer, and the first opening extends when viewed in the thickness direction.

17 Claims, 12 Drawing Sheets

(56) References Cited

U.S. PATENT DOCUMENTS

| | | | | |
|---|---|---|---|---|
| 5,696,389 | A * | 12/1997 | Ishikawa | B82Y 20/00 257/773 |
| 5,963,576 | A * | 10/1999 | Claisse | H01S 5/18391 372/45.01 |
| 6,717,256 | B1 * | 4/2004 | Suzuki | H01L 24/97 257/100 |
| 7,952,172 | B2 * | 5/2011 | Watanabe | H01L 31/022408 257/170 |
| 9,929,536 | B1 * | 3/2018 | Lin | H01S 5/18344 |
| 2002/0134987 | A1 * | 9/2002 | Takaoka | G02B 6/4202 257/98 |
| 2005/0051784 | A1 * | 3/2005 | Niigaki | H01L 31/03046 257/95 |
| 2005/0169336 | A1 * | 8/2005 | Ishii | B82Y 20/00 372/50.1 |
| 2006/0045162 | A1 * | 3/2006 | Johnson | B82Y 20/00 372/99 |
| 2006/0110839 | A1 * | 5/2006 | Dawson | H01L 27/156 438/22 |
| 2006/0192088 | A1 * | 8/2006 | Koyama | H01S 5/0261 250/214 R |
| 2007/0091962 | A1 * | 4/2007 | Murakami | H01S 5/18311 372/50.124 |
| 2008/0069166 | A1 * | 3/2008 | Lee | H01S 5/0425 372/50.11 |
| 2009/0032908 | A1 * | 2/2009 | Masui | H01L 22/12 257/623 |
| 2009/0180506 | A1 * | 7/2009 | Maeda | H01S 5/18394 372/44.01 |
| 2011/0115872 | A1 * | 5/2011 | Harasaka | B41J 2/45 347/224 |
| 2011/0116147 | A1 * | 5/2011 | Motomura | B41J 2/473 359/204.1 |
| 2012/0121297 | A1 * | 5/2012 | Jikutani | B82Y 20/00 399/221 |
| 2013/0064263 | A1 * | 3/2013 | Chen | H01S 5/18313 372/50.11 |
| 2013/0221223 | A1 * | 8/2013 | Caneau | H01S 5/18308 250/340 |
| 2013/0287056 | A1 * | 10/2013 | Gerard | H01S 3/08018 372/50.1 |
| 2017/0221995 | A1 * | 8/2017 | Taylor | H01L 29/15 |
| 2018/0019574 | A1 * | 1/2018 | Jogan | H01S 5/0264 |

FOREIGN PATENT DOCUMENTS

| | | | | |
|---|---|---|---|---|
| JP | | 2011009693 A | * 1/2011 | H01S 5/18391 |
| JP | | 2011135031 A | * 7/2011 | B41J 2/45 |
| WO | WO 2012140544 A1 | | * 10/2012 | H01S 5/18313 |

* cited by examiner

SURFACE EMITTING LASER ELEMENT AND OPTICAL DEVICE

CROSS-REFERENCE TO RELATED APPLICATION(S)

This application is based upon and claims the benefit of priority from Japanese Patent Application No. 2017-003332, filed on Jan. 12, 2017, the entire contents of which are incorporated herein by reference.

TECHNICAL FIELD

The present disclosure relates to a surface emitting laser element and an optical device.

BACKGROUND

Conventionally, laser diodes have been widely used in various fields. In a laser diode, induced emission is caused in an emission layer (active layer) that is interposed between a p-type region and an n-type region, and light generated thereby is extracted.

More specifically, light emitted by electrons, which have high energy and return to a low energy state, is reflected inside the emission layer using a mirror formed by cleavage planes or the like to promote induced emission. By repeatedly reflecting the light, intense light having a uniform phase is generated and extracted as laser light. Also, current continuously flows through a PN junction and laser light is continuously extracted.

SUMMARY

Some embodiments of the present disclosure provide a surface emitting laser element capable of further increasing an optical power while further reducing a light exit angle.

According to an aspect of the present disclosure, there is provided a surface emitting laser element, including a first distribution Bragg reflector (DBR) layer having a first conductivity type; a second DBR layer having a second conductivity type opposite to the first conductivity type; an active layer located between the first DBR layer and the second DBR layer; an insulating layer formed over the second DBR layer; and a surface conductive layer formed over the insulating layer, wherein a first opening, which exposes the insulating layer and overlaps with the active layer when viewed in a thickness direction of the first DBR layer, is formed in the surface conductive layer, and the first opening extends when viewed in the thickness direction.

According to another aspect of the present disclosure, there is provided an optical device, including the surface emitting laser element; a mounting board on which the surface emitting laser element is arranged; and a wire bonded to the surface emitting laser element and the mounting board.

Other features and advantages of the present disclosure will become more apparent from the detailed description given below with reference to the accompanying drawings.

DETAILED DESCRIPTION

Embodiments of the present disclosure will now be described in detail with reference to the drawings.

First Embodiment

A first embodiment of the present disclosure will be described with reference to FIGS. 1 to 6.

Figure 1:
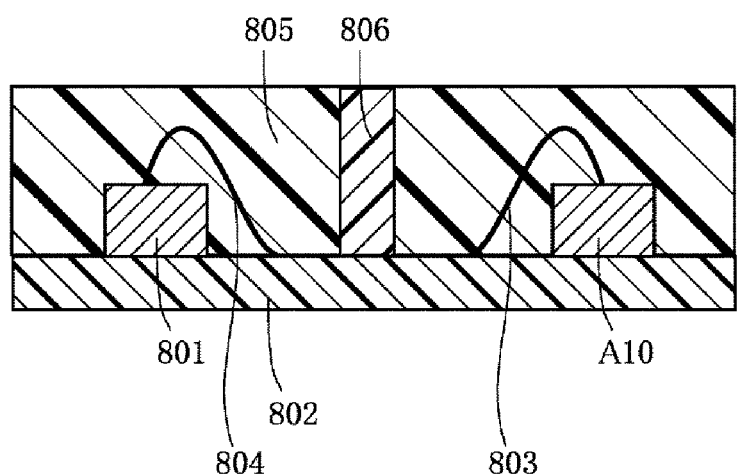
FIG. 1 is a cross sectional view of an optical device according to a first embodiment of the present disclosure.

FIG. 1 is a cross sectional view of an optical device according to the first embodiment of the present disclosure. An optical device B1 illustrated in FIG. 1 is, for example, a photo interrupter. The optical device B1 includes a surface emitting laser element A10, a light receiving element 801, a mounting board 802, wires 803 and 804, a sealing resin 805, and a light shielding portion 806.

The surface emitting laser element A10 and the light receiving element 801 are arranged on the mounting board 802. Light emitted from the surface emitting laser element A10 is reflected from an object (not shown) and received by the light receiving element 801. The wire 803 is bonded to the surface emitting laser element A10 and the mounting board 802. The wire 804 is bonded to the light receiving element 801 and the mounting board 802. The light shielding portion 806 is vertically installed on the mounting board 802 and is arranged between the surface emitting laser element A10 and the light receiving element 801. The light shielding portion 806 serves to prevent the light, which is emitted from the surface emitting laser element A10, from being directly incident to the light receiving element 801. The sealing resin 805 covers the surface emitting laser element A10, the light receiving element 801, the mounting board 802, the wires 803 and 804, and the light shielding portion 806.

The optical device B1 may not have the light receiving element 801 or the wires 803 and 804.

Figure 2:
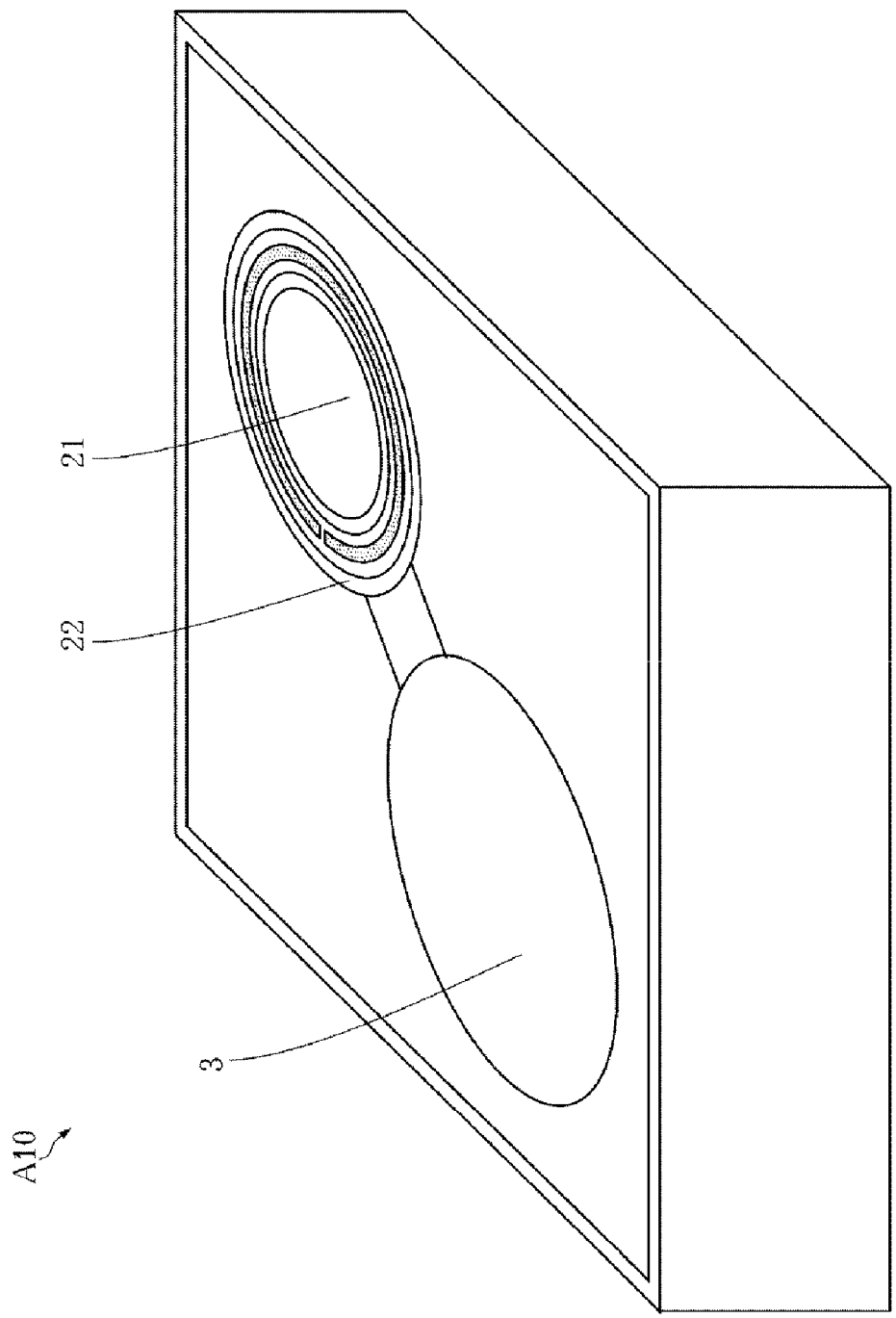
FIG. 2 is a perspective view of a surface emitting laser element according to the first embodiment.
Figure 3:
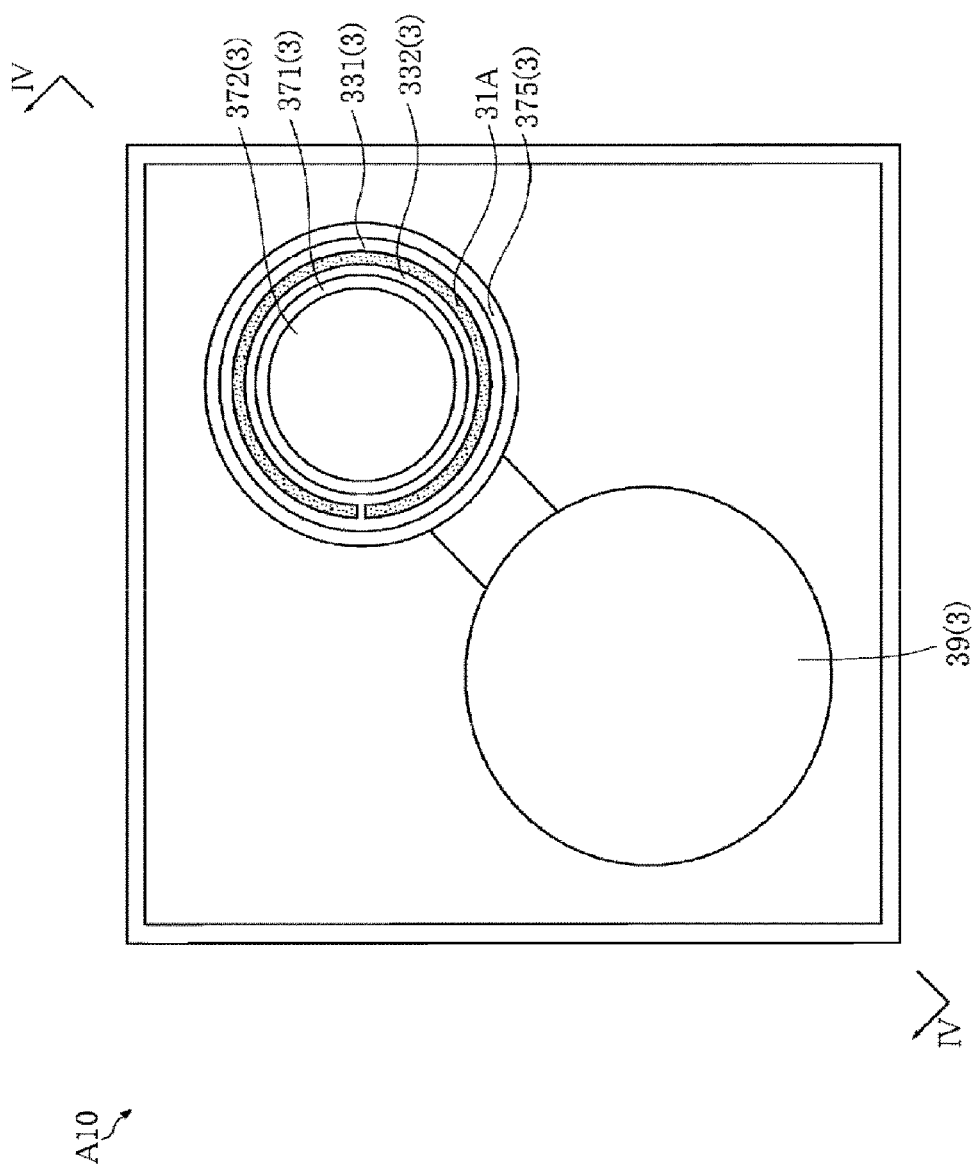
FIG. 3 is a plane view of the surface emitting laser element according to the first embodiment.
Figure 4:
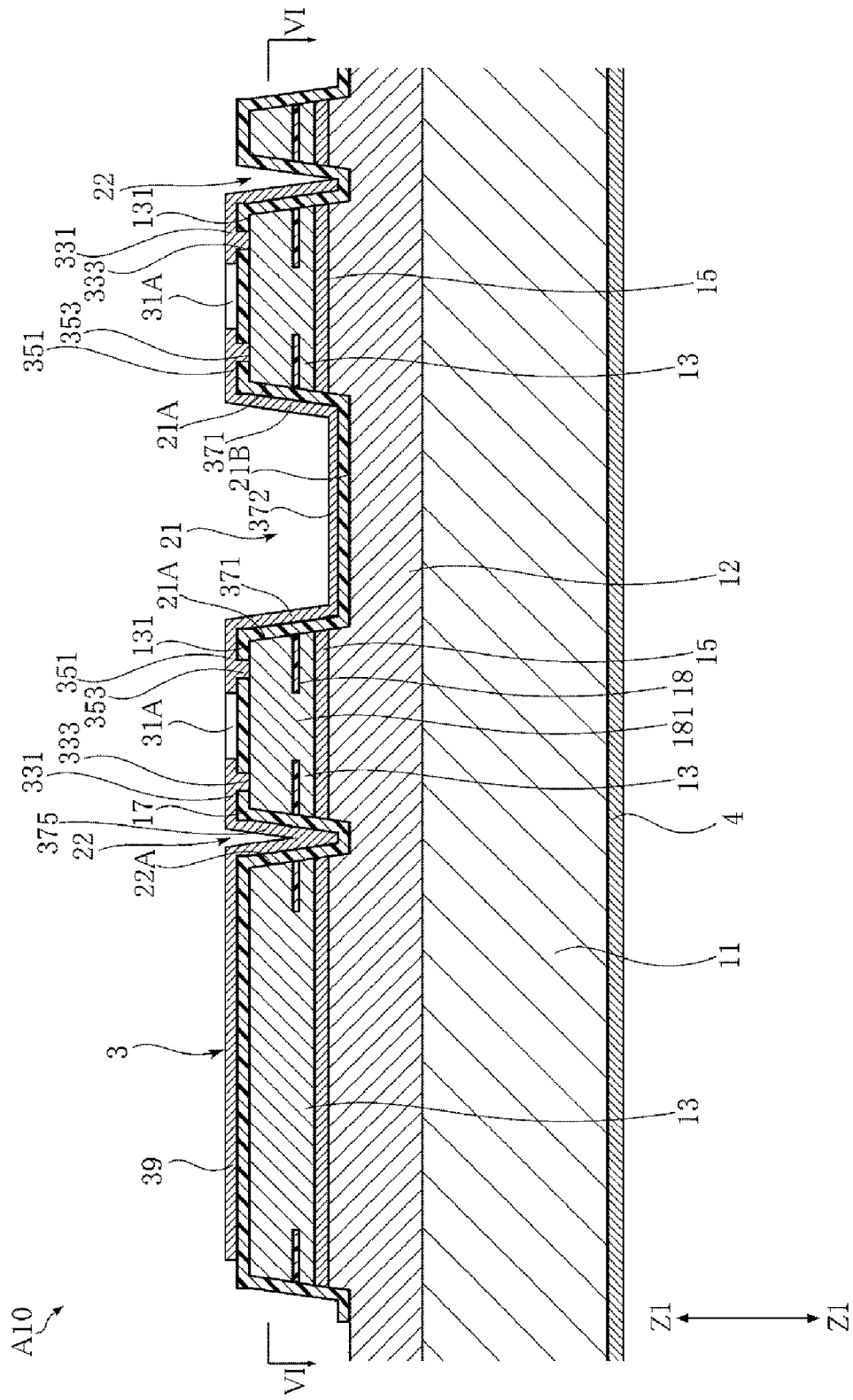
FIG. 4 is a cross sectional view taken along line IV-IV in FIG. 3.
Figure 5:
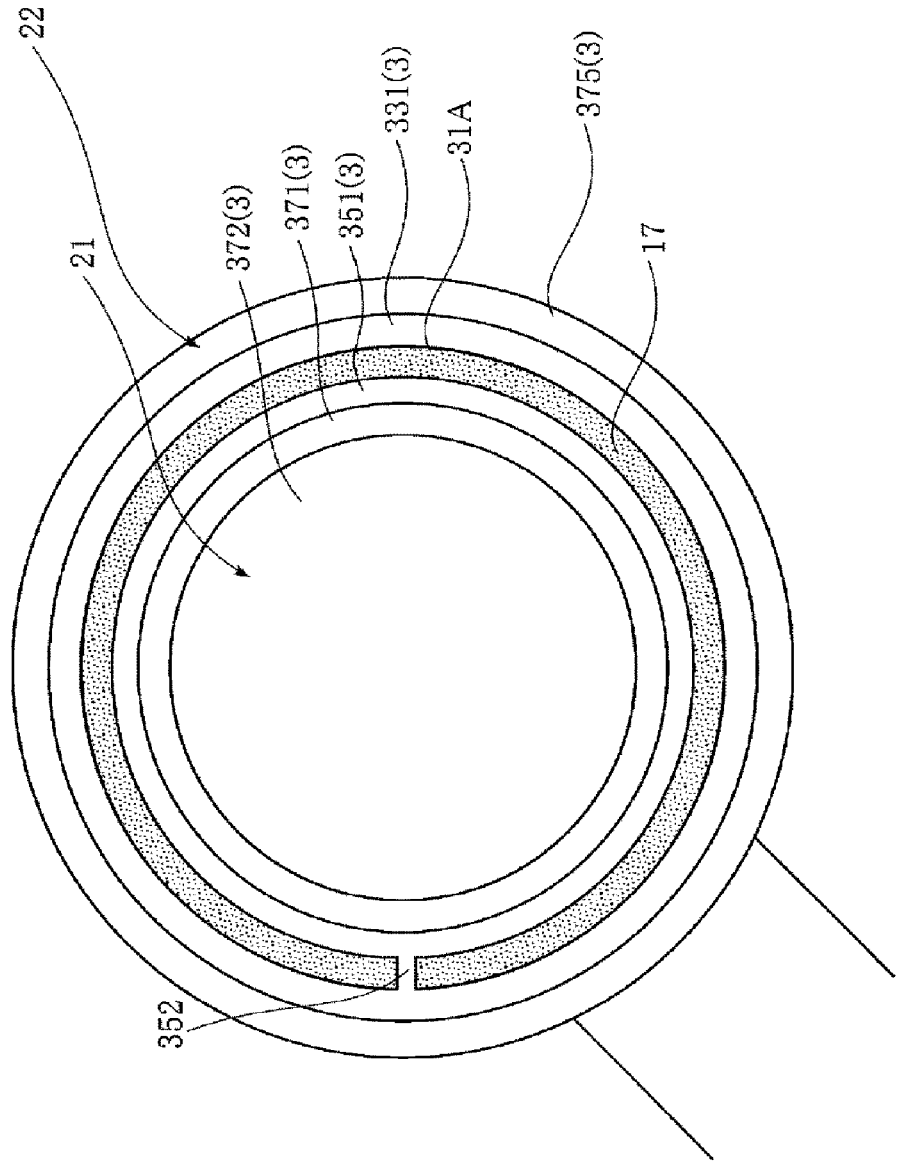
FIG. 5 is a partially enlarged plan view of the surface emitting laser element illustrated in FIG. 3.
Figure 6:
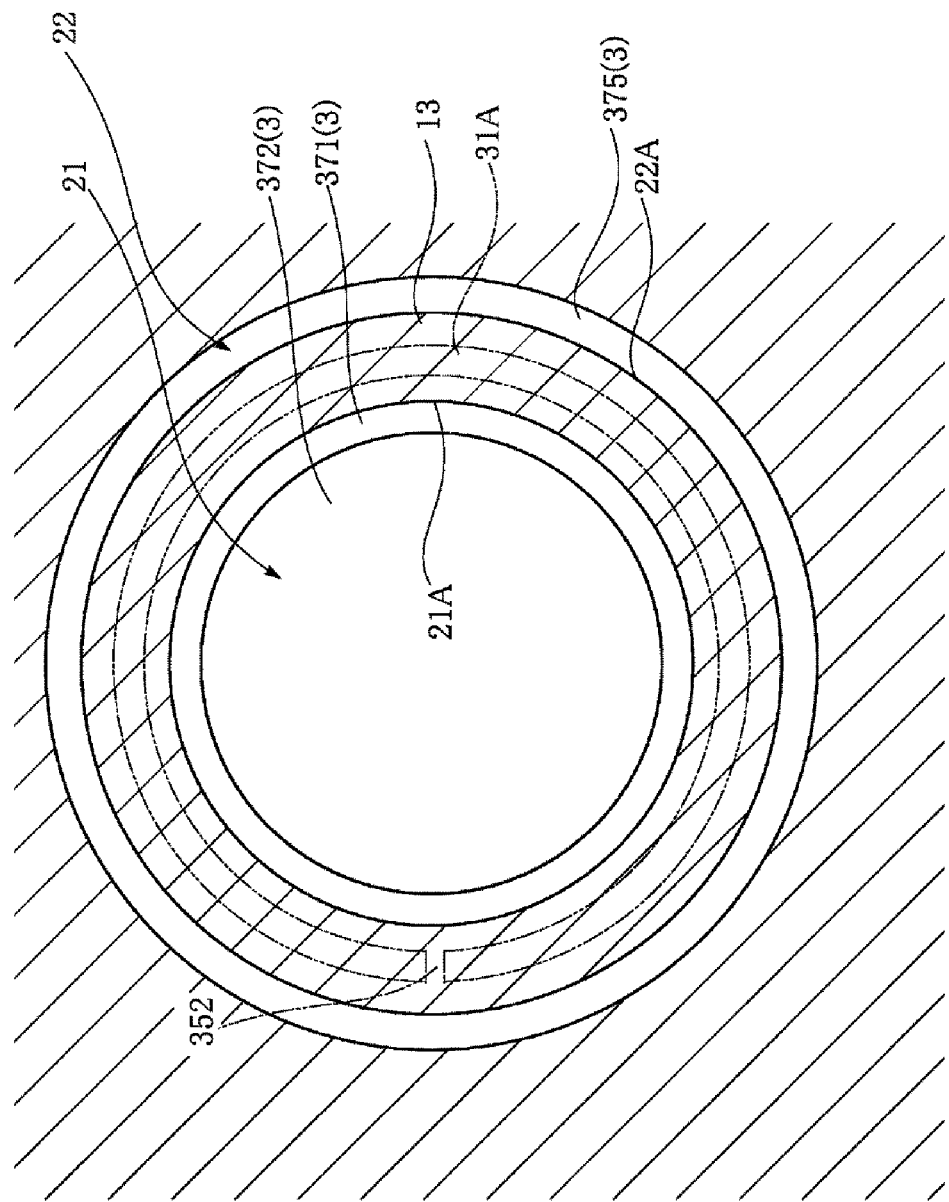
FIG. 6 is a partially enlarged sectional view taken along the line VI-VI in FIG. 4.

FIG. 2 is a perspective view of the surface emitting laser element according to the first embodiment. FIG. 3 is a plane view of the surface emitting laser element according to the first embodiment. FIG. 4 is a cross sectional view taken along line IV-IV in FIG. 3. FIG. 5 is a partially enlarged plane view of the surface emitting laser element illustrated in FIG. 3. FIG. 6 is a partially enlarged sectional view taken along line VI-VI in FIG. 4.

The surface emitting laser element A10 illustrated in these drawings is a laser diode, and more specifically, a vertical cavity surface emitting laser (VCSEL) type laser diode. The surface emitting laser element A10 has a rectangular shape which is, for example, 100 μm to 300 μm in length and 100 μm to 300 μm in width in a plan view. The surface emitting laser element A10 has a semiconductor substrate 11, a first distribution Bragg reflector (DBR) layer 12, a second DBR layer 13, an active layer 15, an insulating layer 17, a current confinement layer 18, a surface conductive layer 3, and a rear conductive layer 4.

The semiconductor substrate 11 is made of a semiconductor. The semiconductor forming the semiconductor substrate 11 is, for example, GaAs.

The active layer 15 is made of a compound semiconductor that emits light having a wavelength of 980 nm band (hereinafter, referred to as "λa") by spontaneous emission or induced emission. The active layer 15 is located between the first DBR layer 12 and the second DBR layer 13.

The first DBR layer 12 is formed over the semiconductor substrate 11. The first DBR layer 12 is made of a first conductivity type semiconductor. In this embodiment, the first conductivity type is an n-type. The first DBR layer 12 is configured as a DBR for effectively reflecting light that is emitted from the active layer 15. More specifically, the first DBR layer 12 is an AlGaAs layer having a thickness of λa/4 and is formed by overlapping pairs of two layers each having a different reflectivity in multiple stages.

The second DBR layer 13 is made of a second conductivity type semiconductor. In this embodiment, the second conductivity type is a p-type. Unlike this embodiment, the first conductivity type may be a p-type and the second conductivity type may be an n-type. The first DBR layer 12 is located between the second DBR layer 13 and the semiconductor substrate 11. The second DBR layer 13 is configured as a DBR for effectively reflecting light that is emitted from the active layer 15. More specifically, the second DBR layer 13 is an AlGaAs layer having a thickness of λa/4 and is formed by overlapping pairs of two layers each having a different reflectivity in multiple stages.

The second DBR layer 13 has a DBR layer surface 131. The DBR layer surface 131 is located on an opposite side from where the first DBR layer 12 is located.

As illustrated in FIG. 4, the current confinement layer 18 is located inside the second DBR layer 13. The current confinement layer 18 is configured as a layer which has a large amount of Al and which is easily oxidized. The current confinement layer 18 is formed by oxidizing the easily-oxidizable layer. The current confinement layer 18 is not necessarily formed by oxidation and may be formed by any other method (e.g., ion implantation). The current confinement layer 18 has an opening 181 formed thereon. Current flows through the corresponding opening.

As illustrated in FIGS. 4 to 6, a first recess 21 and a second recess 22 are formed in the second DBR layer 13.

The first recess 21 is recessed from the DBR layer surface 131. In this embodiment, the first recess 21 reaches the first DBR layer 12. The first recess 21 has a first recess side surface 21A and a first recess bottom surface 21B. At least a portion of the first recess side surface 21A is configured by the second DBR layer 13. In this embodiment, the first recess side surface 21A has a portion configured by the first DBR layer 12. The first recess side surface 21A has a shape that that makes a circuit, when viewed in a thickness direction Z1 (in a plan view) of the first DBR layer 12. The first recess bottom surface 21B faces upwards in FIG. 4. The first recess bottom surface 21B has a circular shape in this embodiment; but is not limited to a circular shape and may have any other shape. The first recess bottom surface 21B is connected to the first recess side surface 21A. In this embodiment, the first recess bottom surface 21B is configured by the first DBR layer 12.

The second recess 22 is recessed from the DBR layer surface 131. In this embodiment, the second recess 22 reaches the first DBR layer 12. The second recess 22 has a second recess side surface 22A. At least a portion of the second recess side surface 22A is configured by the second DBR layer 13. In this embodiment, the second recess side surface 22A has a portion configured by the first DBR layer 12. The second recess side surface 22A is a surface that is opposite to a space surrounded by the first recess side surface 21A. The second recess side surface 22A has a shape that that makes a circuit, when viewed in the thickness direction Z1 (from a plan view) of the first DBR layer 12.

The insulating layer 17 is formed over the second DBR layer 13. In this embodiment, the insulating layer 17 is formed as the DBR layer surface 131 of the second DBR layer 13, the first recess side surface 21A and the first recess bottom surface 21B of the first recess 21, and the second recess side surface 22A of the second recess 22. The insulating layer 17 is made of, for example, $SiO_2$.

The surface conductive layer 3 is formed over the insulating layer 17. In this embodiment, the surface conductive layer 3 is formed over the DBR layer surface 131 of the second DBR layer 13, the first recess side surface 21A and the first recess bottom surface 21B of the first recess 21, and the second recess side surface 22A of the second recess 22, with the insulating layer 17 interposed therebetween. The surface conductive layer 3 is made of a conductive material (e.g., metal).

As illustrated in FIGS. 4 to 6, the surface conductive layer 3 has a first opening 31A formed thereon. Furthermore, in FIG. 5, the first opening 31A is illustrated as having a sand pattern.

The first opening 31A exposes the insulating layer 17 and overlaps with the active layer 15 in the thickness direction Z1 of the first DBR layer 12. The first opening 31A extends in a certain direction when viewed in the thickness direction Z1. In this embodiment, the first opening 31A is annular when viewed in the thickness direction Z1. The first opening 31A has, for example, a closed annular shape or a partially opened annular shape. The annular shape may include a circular annular shape and a polygonal annular shape (e.g., triangular annular shape, a rectangular annular shape, etc.). The partially opened annular shape includes an annular shape in which any one portion is opened and an annular shape in which a plurality of portions are opened. In this embodiment, the first opening 31A has a partially opened circular annular shape (more specifically, a circular annular shape in which any one portion is opened). The first recess 21 is arranged on an inner position, relative to the first opening 31A, when viewed in the thickness direction Z1. As can be understood from FIG. 4, the first opening 31A overlaps with the opening 181 of the current confinement layer 18 when viewed in the thickness direction Z1. The first opening 31A of the surface conductive layer 3 and the opening 181 of the current confinement layer 18 extend in the same direction when viewed in the thickness direction Z1 (not shown). Specifically, the first opening 31A and the opening 181 extend to have an annular shape when viewed in the thickness direction Z1 (not shown).

As illustrated in FIGS. 4 to 6, the surface conductive layer 3 includes a first surface portion 331, a first contact portion 333, a second surface portion 351, a connecting portion 352, a second contact portion 353, a side surface portion 371, a bottom surface portion 372, a side surface portion 375, and a wire bonding pad 39.

The first surface portion 331 defines a portion of the first opening 31A. The first contact portion 333 is located between the first surface portion 331 and the second DBR layer 13. The first contact portion 333 penetrates through the insulating layer 17. The first contact portion 333 is electrically connected to the first surface portion 331 and the second DBR layer 13. Thus, current flows between the first surface portion 331 and the second DBR layer 13 via the first contact portion 333.

The second surface portion 351 defines a portion of the first opening 31A. The second surface portion 351 is separated from the first surface portion 331 with the first opening 31A interposed therebetween, when viewed in the thickness direction Z1. As illustrated in FIG. 5, the connecting portion 352 is located between the first surface portion 331 and the second surface portion 351. The connecting portion 352 is electrically connected to the first surface portion 331 and the second surface portion 351. Thus, the second surface portion 351 is electrically connected to the first surface portion 331. In this embodiment, only one connecting portion 352 is formed, but a plurality of connecting portions may also be formed. The second contact portion 353 is located between the second surface portion 351 and the second DBR layer 13. The second contact portion 353 penetrates through the insulating layer 17. The second contact portion 353 is electrically connected to the second surface portion 351 and the second DBR layer 13. Thus, current flows between the second surface portion 351 and the second DBR layer 13 via the second contact portion 353.

Unlike this embodiment, the surface conductive layer 3 may not include the connecting portion 352 and the second contact portion 353.

The side surface portion 371 is formed over the first recess side surface 21A. The side surface portion 371 is electrically connected to the second surface portion 351, both of which are connected to each other in this embodiment. The side surface portion 371, the first surface portion 331, the second surface portion 351, and the first opening 31A extend in the same direction when viewed in the thickness direction Z1. As illustrated in FIG. 5, in this embodiment, the side surface portion 371, the first surface portion 331, the second surface portion 351, and the first opening 31A extend to have an annular shape when viewed in the thickness direction Z1.

The bottom surface portion 372 is formed over the first recess bottom surface 21B. The bottom surface portion 372 is electrically connected to the side surface portion 371, both of which are connected to each other in this embodiment. In this embodiment, the bottom surface portion 372 has a circular shape.

The side surface portion 375 is formed on the second recess side surface 22A. The side surface portion 375 is electrically connected to the first recess side surface 21A, both of which are connected to each other in this embodiment.

The wire bonding pad 39 is formed over the DBR layer surface 131. The second recess 22 is located between the wire bonding pad 39 and the first opening 31A when viewed in the thickness direction Z1. The wire bonding pad 39 is electrically connected to the first surface portion 331 via the side surface portion 375. In this embodiment, the wire bonding pad 39 is also electrically connected to the second surface portion 351 via the side surface portion 375, the first surface portion 331, and the connecting portion 352. The wire 803 (see FIG. 1) is bonded to the wire bonding pad 39.

The rear conductive layer 4 is formed over a lower surface of the semiconductor substrate 11 in FIG. 4. The rear conductive layer 4 is made of a conductive material (e.g., metal). The semiconductor substrate 11 is located between the rear conductive layer 4 and the first DBR layer 12.

Next, operational effects of this embodiment will be described.

In this embodiment, the first opening 31A extends in a certain direction when viewed in the thickness direction Z1. The inventors of the present disclosure found that such a configuration can increase optical power while further reducing a light exit angle. It is considered that one of the reasons is because light can travel in a transverse direction (a direction perpendicular to the thickness direction Z1) in a portion below the first opening 31A (this portion includes the active layer 15 located between the first DBR layer 12 and the second DBR layer 13). When the optical power can be further increased while a light exit angle is further reduced, if the optical device B1 is, for example, a photo interrupter, it can irradiate light farther and a larger amount of light to a necessary portion. Therefore, it is possible to further enhance the performance of the optical device B1.

In this embodiment, the first opening 31A has an annular shape when viewed in the thickness direction Z1. With this configuration, since light from the active layer 15 can circulate within an annular mesa, it is appropriate to confine light to the portion below the first opening 31A and allow that light to travel in the transverse direction (the direction perpendicular to the thickness direction Z1). Thus, according to the above configuration of this embodiment, it is possible to further increase the optical power while further reducing the light exit angle.

In this embodiment, the first recess 21 has the first recess side surface 21A having at least a portion configured by the second DBR layer 13. The surface conductive layer 3 includes the side surface portion 371 formed over the first recess side surface 21A. With this configuration, light emitted from the active layer 15, which is within the portion configured by the first DBR layer 12, the second DBR layer 13, and the active layer 15, can be reflected from the first recess side surface 21A of the first recess 21 or the side surface portion 371. Thus, that light can be prevented from being emitted outside of the second DBR layer 13. As a result, the light from the active layer 15 can be more appropriately confined to the portion below the first opening 31A in the second DBR layer 13. Therefore, with the above configuration of this embodiment, it is possible to further increase the optical power while further reducing the light exit angle.

In this embodiment, the surface conductive layer 3 includes the connecting portion 352 and the second contact portion 353. The connecting portion 352 is located between the first surface portion 331 and the second surface portion 351 and electrically connected to the first surface portion 331 and the second surface portion 351. The second contact portion 353 is located between the second surface portion 351 and the second DBR layer 13 and electrically connected to the second surface portion 351 and the second DBR layer 13. With this configuration, a current path oriented from the second surface portion 351 toward the first DBR layer 12 via the second contact portion 353 is formed, in addition to a current path oriented from the first surface portion 331 toward the first DBR layer 12 via the first contact portion 333. Thus, it can be expected that light is more appropriately generated in the active layer 15.

First Modification of First Embodiment

A first modification of the first embodiment in the present disclosure will be described with reference to FIG. 7.

In describing the following modification, the same or similar components will be denoted by the same reference numerals and descriptions thereof will be properly omitted.

Figure 7:
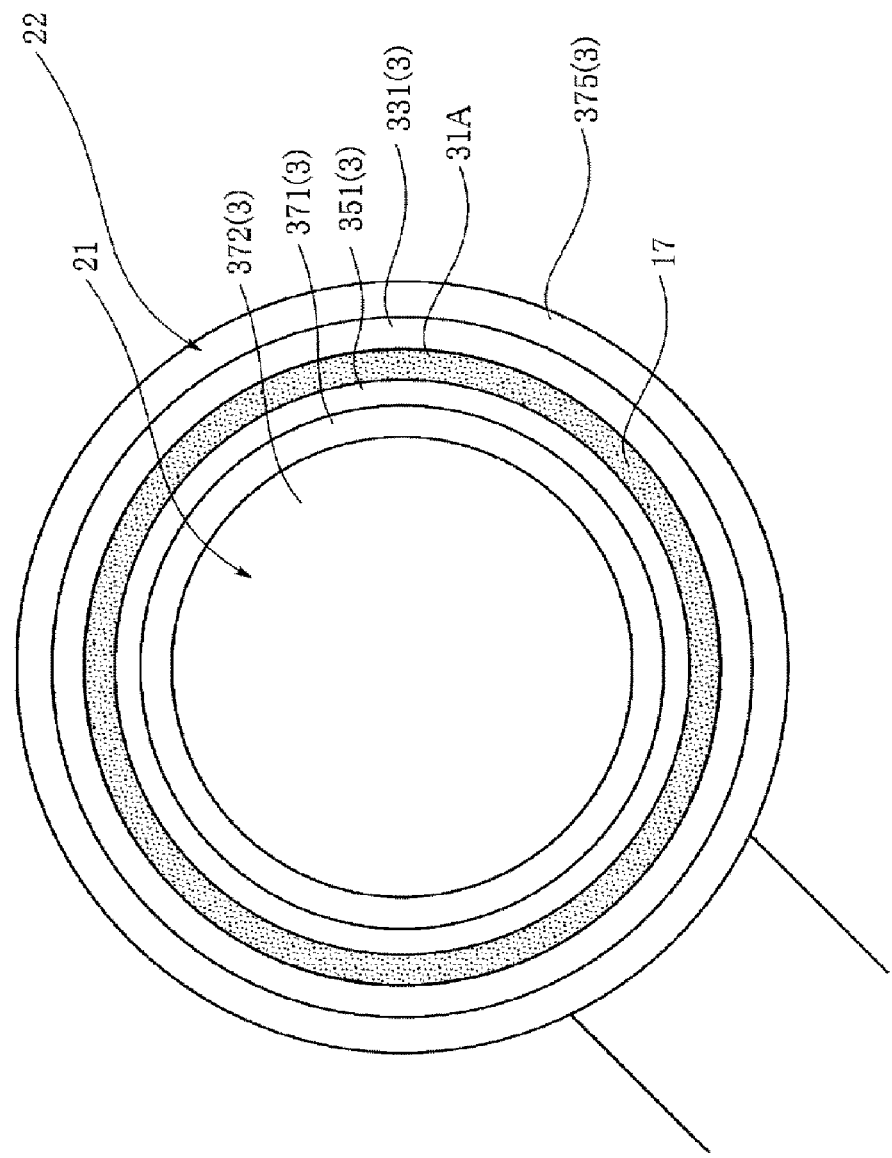
FIG. 7 is a plan view of a surface emitting laser element according to a first modification of the first embodiment.
Figure 8:
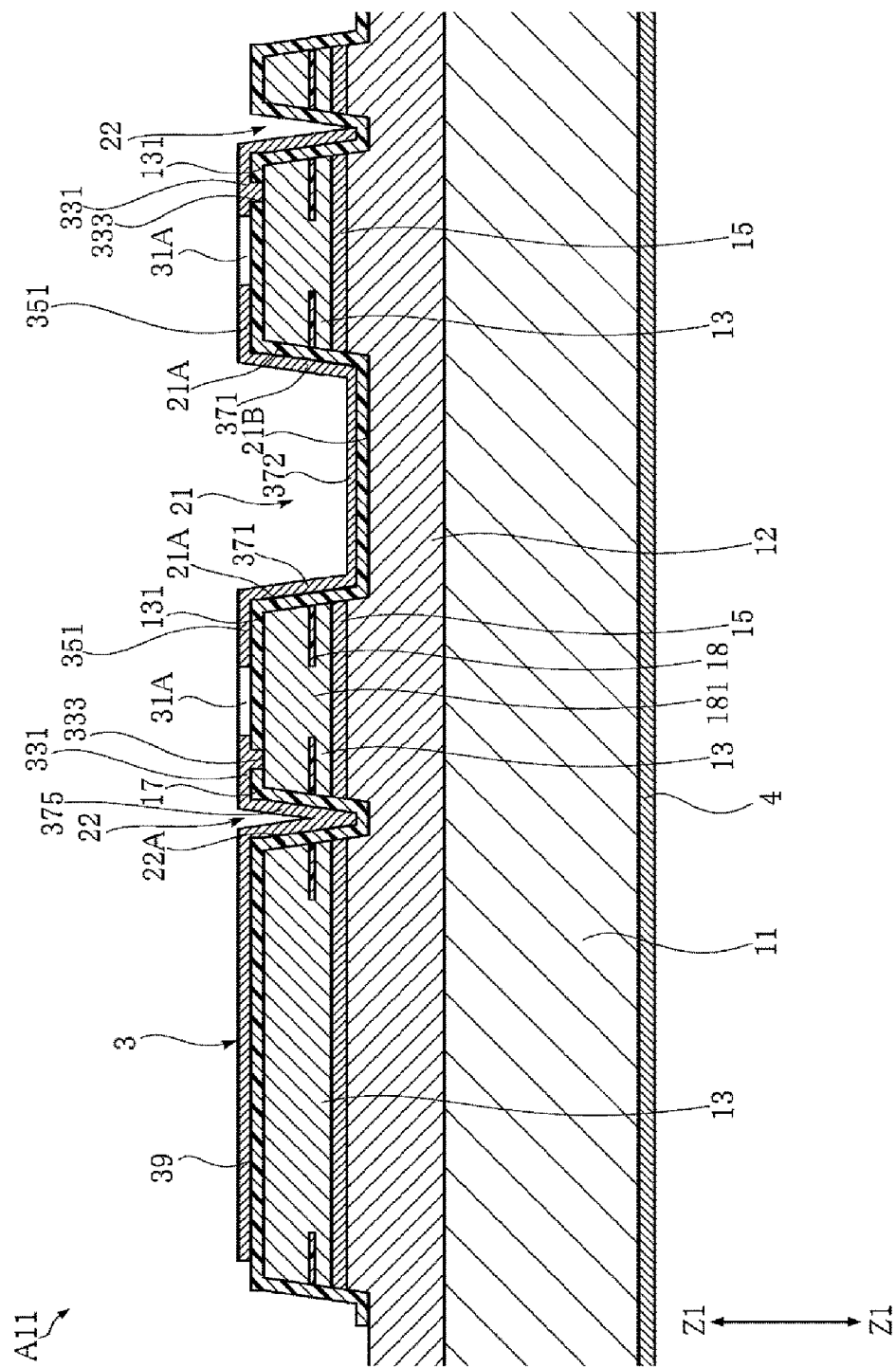
FIG. 8 is a cross sectional view of the surface emitting laser element according to the first modification of the first embodiment.

FIG. 7 is a plan view of a surface emitting laser element according to the first modification of the first embodiment. FIG. 8 is a cross sectional view of the surface emitting laser element according to the first modification of the first embodiment.

A surface emitting laser element A11 illustrated in FIGS. 7 and 8 is different from the surface emitting laser element A10 in that it has an annular shape with the first opening 31A closed. Furthermore, in the surface emitting laser element A11, the surface conductive layer 3 does not have the connecting portion 352 and the second contact portion 353.

Second Modification of First Embodiment

A second modification of the first embodiment in the present disclosure will be described with reference to FIG. 9.

Figure 9:
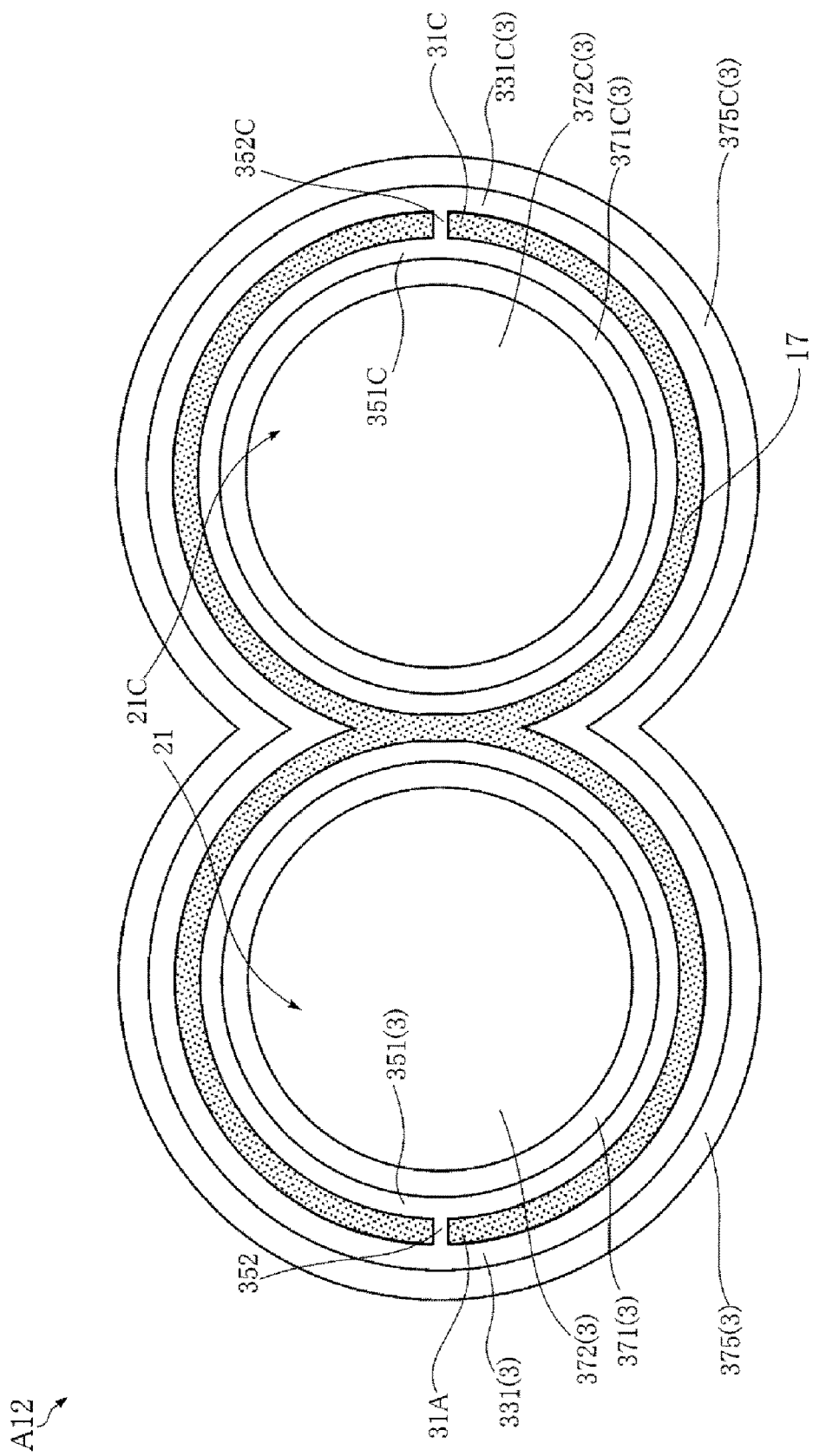
FIG. 9 is a plan view of a surface emitting laser element according to a second modification of the first embodiment.

FIG. 9 is a plane view of a surface emitting laser element according to the second modification of the first embodiment.

A surface emitting laser element A12 illustrated in FIG. 9 is different from the surface emitting laser element A10 in that it has an additional opening 31C. In this modification, the additional opening 31C has a line symmetrical shape with the first opening 31A, but may have any shape. The additional opening 31C exposes the insulating layer 17 and overlaps with the active layer 15 when viewed in the thickness direction Z1 of the first DBR layer 12. The additional opening 31C has an annular shape and is connected to the first opening 31A.

A recess 21C, a surface portion 331C, a surface portion 351C, a connecting portion 352C, a side surface portion 371C, a bottom surface portion 372C, and a side surface portion 375C are installed in the surface emitting laser element A12. These portions correspond to the first recess 21, the first surface portion 331, the second surface portion 351, the connecting portion 352, the side surface portion 371, the bottom surface portion 372, and the side surface portion 375 of the surface emitting laser element A10, respectively, and since the same descriptions can be applied thereto, descriptions thereof will be omitted in this modification.

According to this modification, it is possible to obtain the following operational effects, in addition to the operational effects described with regard to the surface emitting laser element A10.

In this modification, light from the active layer 15 can travel between the portion below the first opening 31A and a portion below the additional opening 31C. With the above configuration, the inventors of the present disclosure recognized that it is possible to further increase the optical power while further reducing the light exit angle. The configuration of this modification may be combined with the configuration of the surface emitting laser element A11 described above.

Third Modification of First Embodiment

A third modification of the first embodiment in this disclosure will be described with reference to FIGS. 10 and 11.

Figure 10:
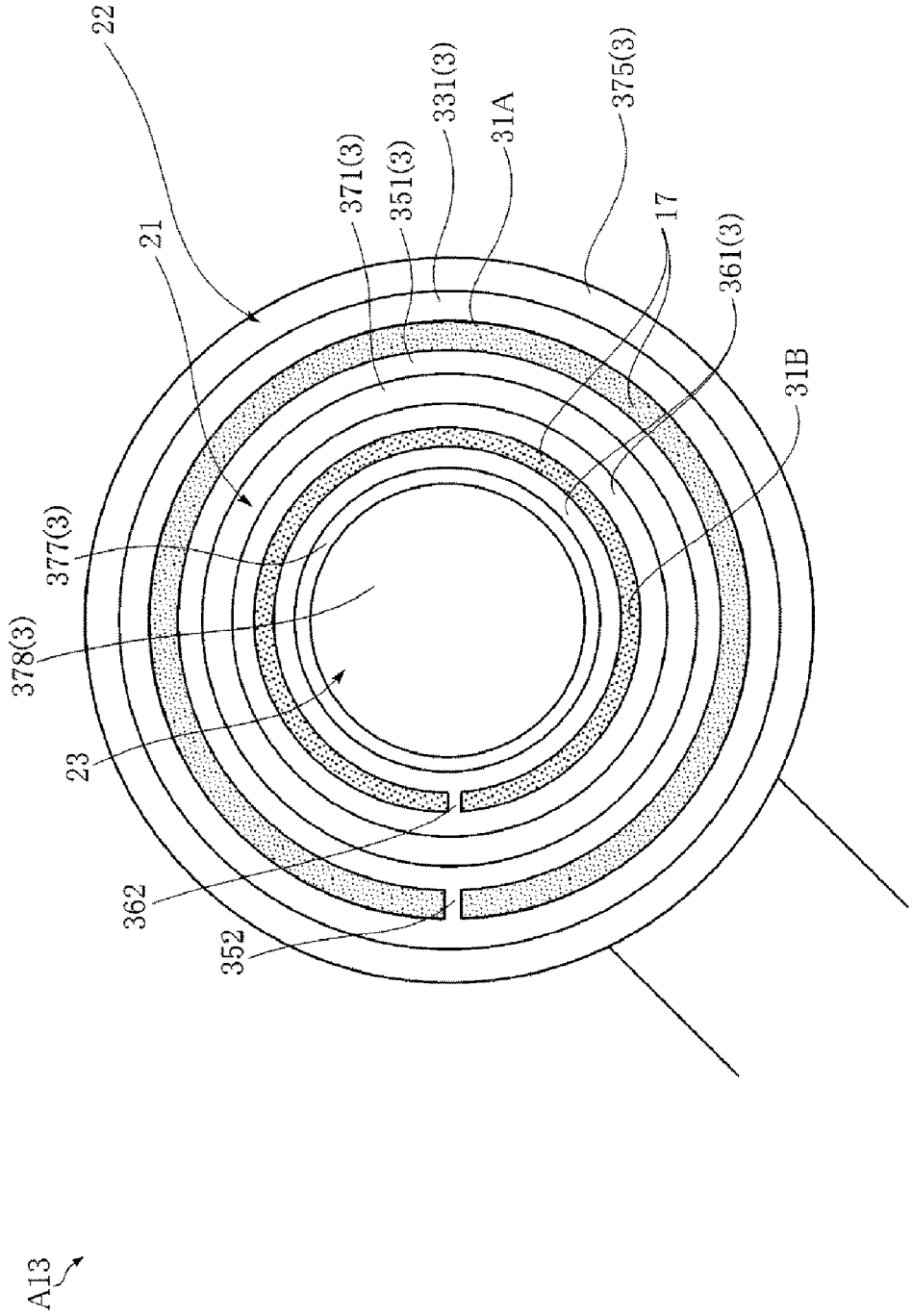
FIG. 10 is a plan view of a surface emitting laser element according to a third modification of the first embodiment.

FIG. 10 is a plan view of a surface emitting laser element according to the third modification of the first embodiment. FIG. 11 is a cross sectional view of the surface emitting laser element according to the third modification of the first embodiment. FIG. 11 is a cross sectional view corresponding to FIG. 6.

Figure 11:
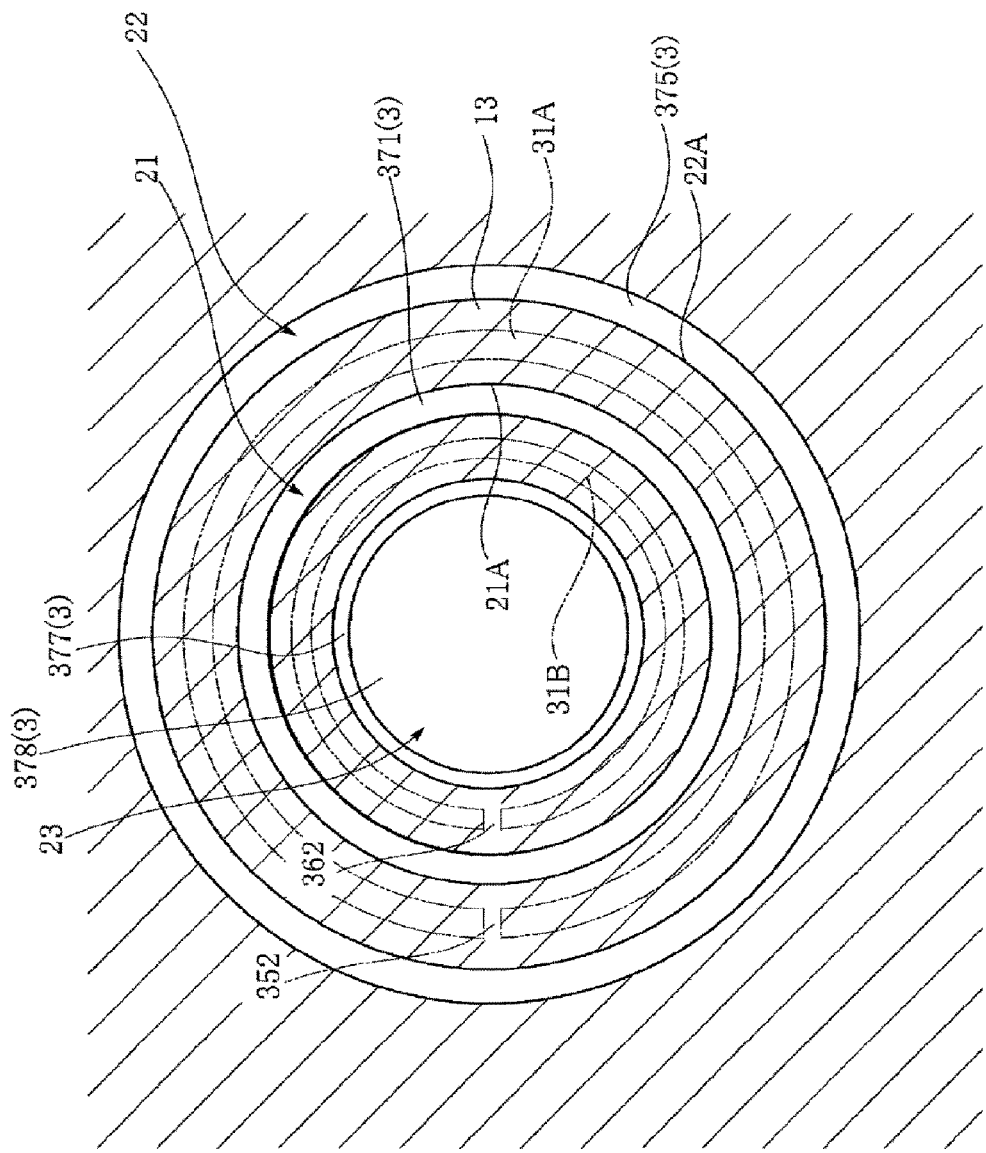
FIG. 11 is a cross sectional view of the surface emitting laser element according to the third modification of the first embodiment.

In a surface emitting laser element A13 illustrated in FIGS. 10 and 11, the shape of the second DBR layer 13 is different from that of the surface emitting laser element A10. A second opening 31B is formed in the surface conductive layer 3. The second opening 31B exposes the insulating layer 17 and overlaps with the active layer 15 when viewed in the thickness direction Z1. The second opening 31B is defined by two surface portions 361. The two surface portions 361 are electrically connected to each other via the connecting portion 362. Furthermore, the surface portion 361 and the second DBR layer 13 are electrically connected to each other via a contact portion (not shown). The second opening 31B is located inside the first recess 21 when viewed in the thickness direction Z1. In this modification, the second opening 31B has an annular shape when viewed in the thickness direction Z1. For the purpose of the annular shape, the above descriptions may be applied. A third recess 23 recessed from the DBR layer surface 131 is formed in the surface emitting laser element A13. A side surface portion 377 and a bottom surface portion 378 of the surface conductive layer 3 are formed over the side surface and the bottom surface of the third recess 23, respectively.

According to this modification, it is possible to obtain the following operational effects, in addition to the operational effects described with regard to the surface emitting laser element A10.

In this modification, it is expected that a portion below the second opening 31B in the second DBR layer 13 performs the same function as that of the portion below the first opening 31A in the second DBR layer 13. As a result, it is possible to further increase the optical power while further reducing the light exit angle. The configuration of this modification may be combined with the configuration of the surface emitting laser element A11 or the surface emitting laser element A12.

Fourth Modification of First Embodiment

A fourth modification of the first embodiment in the present disclosure will be described with reference to FIG. 12.

Figure 12:
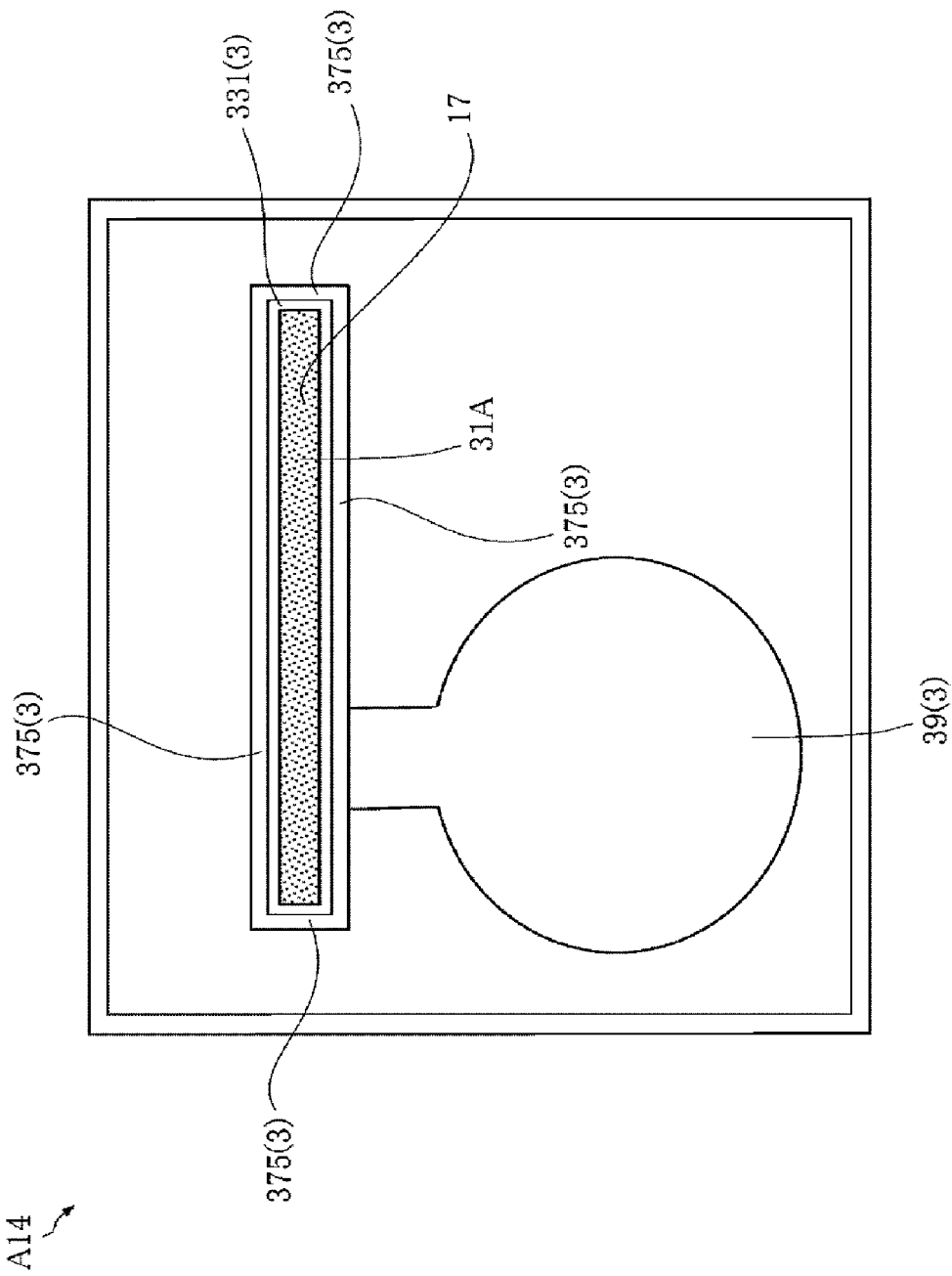
FIG. 12 is a plan view of a surface emitting laser element according to a fourth modification of the first embodiment.

FIG. 12 is a plan view of a surface emitting laser element according to the fourth modification of the first embodiment.

A surface emitting laser element A14 illustrated in FIG. 12 is different from the surface emitting laser element A10 in that the first opening 31A extends in a certain direction along a straight line (a virtual straight line extending in the traverse direction in this modification) (not shown), rather than having an annular shape. Even with this configuration, since light can travel in the traverse direction (a direction orthogonal to the thickness direction Z1) (in this modification, since light can travel further), it is possible to further increase the optical power while further reducing the light exit angle.

The present disclosure is not limited to the above embodiments. The specific components of each part of the present disclosure can be variously changed in design.

Aspects of Present Disclosure

Hereinafter, some aspects of the present disclosure will be additionally described as supplementary notes.

(Supplementary Note 1)

A surface emitting laser element, including: a first distribution Bragg reflector (DBR) layer having a first conductivity type; a second DBR layer having a second conductivity type opposite to the first conductivity type; an active layer located between the first DBR layer and the second DBR layer; an insulating layer formed over the second DBR layer; and a surface conductive layer formed over the insulating layer, wherein a first opening, which exposes the insulating layer and overlaps with the active layer when viewed in a thickness direction of the first DBR layer, is formed in the surface conductive layer, and the first opening extends when viewed in the thickness direction.

(Supplementary Note 2)

In the element of Supplementary Note 1, the first opening has an annular shape when viewed in the thickness direction.

(Supplementary Note 3)

In the element of Supplementary Note 2, the surface conductive layer may include: a first surface portion defining a portion of the first opening; and a first contact portion located between the first surface portion and the second DBR layer, and electrically connected to the first surface portion and the second DBR layer.

(Supplementary Note 4)

In the element of Supplementary Note 2 or 3, the second DBR layer may include a DBR layer surface that is located on an opposite side from where the first DBR layer is located, and a first recess may be recessed from the DBR layer surface and is arranged inside the first opening when viewed in the thickness direction.

(Supplementary Note 5)

In the element of Supplementary Note 4, the first recess may reach the first DBR layer.

(Supplementary Note 6)

In the element of Supplementary Note 4 or 5, the first recess may include a recess side surface having at least a portion configured by the second DBR layer, and the surface conductive layer may include a side surface portion formed over the recess side surface.

(Supplementary Note 7)

In the element of Supplementary Note 6, the side surface portion and the first opening may extend in the same direction when viewed in the thickness direction.

(Supplementary Note 8)

In the element of Supplementary Note 1, the first opening may include a closed annular shape or a partially opened annular shape.

(Supplementary Note 9)

In the element of Supplementary Note 6, the surface conductive layer may include a second surface portion that defines a portion of the first opening and the second surface portion may be separated from the first surface portion with the first opening interposed therebetween when viewed in the thickness direction, and the second surface portion may be electrically connected to the side surface portion.

(Supplementary Note 10)

In the element of Supplementary Note 9, the second surface portion and the first opening may extend in the same direction when viewed in the thickness direction.

(Supplementary Note 11)

In the element of Supplementary Note 9 or 10, the surface conductive layer may include: a connecting portion located between the first surface portion and the second surface portion and electrically connected to the first surface portion and the second surface portion; and a second contact portion located between the second surface portion and the second DBR layer and electrically connected to the second surface portion and the second DBR layer.

(Supplementary Note 12)

In the element of Supplementary Note 4, a second opening, which exposes the insulating layer and overlaps with the active layer in the thickness direction, may be formed in the surface conductive layer, and the second opening may be located inside the first recess when viewed in the thickness direction.

(Supplementary Note 13)

In the element of Supplementary Note 12, the second opening may have an annular shape in the thickness direction.

(Supplementary Note 14)

In the element of Supplementary Note 2, an additional opening, which exposes the insulating layer and overlaps with the active layer when viewed in the thickness direction of the first DBR layer, may be formed in the surface conductive layer, and the additional opening may have an annular shape and is connected to the first opening.

(Supplementary Note 15)

In the element of any one of Supplementary Notes 1 to 14, the element may further include a current confinement layer located in the second DBR layer, wherein the current confinement layer includes an opening overlapping with the first opening of the surface conductive layer when viewed in the thickness direction, and wherein the opening of the current confinement layer and the first opening of the surface conductive layer extend in the same direction when viewed in the thickness direction.

(Supplementary Note 16)

In the element of any one of Supplementary Notes 1 to 15, the element may further include a semiconductor substrate and a rear conductive layer, wherein the first DBR layer is located between the semiconductor substrate and the second DBR layer, and the semiconductor substrate is located between the first DBR layer and the rear conductive layer, wherein the surface conductive layer includes a wire bonding pad, and a second recess is formed in the surface conductive layer to be recessed from a DBR layer surface, and wherein the second recess is located between the wire bonding pad and the first opening in the thickness direction.

(Supplementary Note 17)

According to another aspect of the present disclosure, there is provided an optical device, including: the surface emitting laser element of any one of Supplementary Notes 1 to 16; a mounting board on which the surface emitting laser element is arranged; and a wire bonded to the surface emitting laser element and the mounting board.

While certain embodiments have been described, these embodiments have been presented via example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A surface emitting laser element, comprising:
   a first distribution Bragg reflector (DBR) layer having a first conductivity type;
   a second DBR layer having a second conductivity type opposite to the first conductivity type;
   an active layer located between the first DBR layer and the second DBR layer;

an insulating layer formed over the second DBR layer; and a surface conductive layer formed over the insulating layer, wherein a first opening, which exposes the insulating layer and overlaps with the active layer when viewed in a thickness direction of the first DBR layer, is formed in the surface conductive layer, and the first opening extends and has an annular shape when viewed in the thickness direction, wherein an additional opening, which exposes the insulating layer and overlaps with the active layer when viewed in the thickness direction of the first DBR layer, is formed in the surface conductive layer, and the additional opening has an annular shape and is connected to the first opening.

2. The surface emitting laser element of claim 1, wherein the surface conductive layer comprises:

a first surface portion defining a portion of the first opening; and a first contact portion located between the first surface portion and the second DBR layer, and electrically connected to the first surface portion and the second DBR layer.

3. The surface emitting laser element of claim 1, wherein the second DBR layer comprises a DBR layer surface that is located on an opposite side from where the first DBR layer is located, and wherein a first recess is recessed from the DBR layer surface and is arranged inside the first opening when viewed in the thickness direction.

4. The surface emitting laser element of claim 3, wherein the first recess reaches the first DBR layer.

5. The surface emitting laser element of claim 3, wherein the first recess comprises a recess side surface having at least a portion configured by the second DBR layer, and wherein the surface conductive layer includes a side surface portion formed over the recess side surface.

6. The surface emitting laser element of claim 5, wherein the side surface portion and the first opening extend in the same direction when viewed in the thickness direction.

7. The surface emitting laser element of claim 1, wherein the first opening has a closed annular shape or a partially opened annular shape.

8. The surface emitting laser element of claim 5, wherein the surface conductive layer comprises a second surface portion that defines a portion of the first opening and the second surface portion is separated from a first surface portion with the first opening interposed therebetween when viewed in the thickness direction, and wherein the second surface portion is electrically connected to the side surface portion.

9. The surface emitting laser element of claim 8, wherein the second surface portion and the first opening extend in the same direction when viewed in the thickness direction.

10. The surface emitting laser element of claim 8, wherein the surface conductive layer comprises:

a connecting portion located between the first surface portion and the second surface portion and electrically connected to the first surface portion and the second surface portion; and a second contact portion located between the second surface portion and the second DBR layer and electrically connected to the second surface portion and the second DBR layer.

11. The surface emitting laser element of claim 1, further comprising a current confinement layer located in the second DBR layer, wherein the current confinement layer comprises an opening overlapping with the first opening of the surface conductive layer when viewed in the thickness direction, and wherein the opening of the current confinement layer and the first opening of the surface conductive layer extend in the same direction when viewed in the thickness direction.

12. The surface emitting laser element of claim 1, further comprising a semiconductor substrate and a rear conductive layer, wherein the first DBR layer is located between the semiconductor substrate and the second DBR layer, and the semiconductor substrate is located between the first DBR layer and the rear conductive layer, wherein the surface conductive layer comprises a wire bonding pad, and a second recess is formed in the surface conductive layer to be recessed from a DBR layer surface, and wherein the second recess is located between the wire bonding pad and the first opening when viewed in the thickness direction.

13. An optical device, comprising:
the surface emitting laser element of claim 1;
a mounting board on which the surface emitting laser element is arranged; and
a wire bonded to the surface emitting laser element and the mounting board.

14. A surface emitting laser element, comprising:
a first distribution Bragg reflector (DBR) layer having a first conductivity type;
a second DBR layer having a second conductivity type opposite to the first conductivity type;
an active layer located between the first DBR layer and the second DBR layer;
an insulating layer formed over the second DBR layer; and
a surface conductive layer formed over the insulating layer, wherein a first opening, which exposes the insulating layer and overlaps with the active layer when viewed in a thickness direction of the first DBR layer, is formed in the surface conductive layer, and the first opening extends and has an annular shape when viewed in the thickness direction, wherein the second DBR layer comprises a DBR layer surface that is located on an opposite side from where the first DBR layer is located, wherein a first recess is recessed from the DBR layer surface and is arranged inside the first opening when viewed in the thickness direction, wherein a second opening, which exposes the insulating layer and overlaps with the active layer when viewed in the thickness direction, is formed in the surface conductive layer, and wherein the second opening is located inside the first recess when viewed in the thickness direction.

15. The surface emitting laser element of claim 14, wherein the second opening has an annular shape when viewed in the thickness direction.

16. A surface emitting laser element, comprising:
a substrate having a first surface that faces a first direction;
a first distribution Bragg reflector (DBR) layer having a first conductivity type and formed over the first surface;

an active layer formed over the first DBR layer;

a second DBR layer having a second conductivity type, which is opposite to the first conductivity type, and formed over the active layer;

an insulating layer formed over the second DBR layer and in contact with a portion of the first DBR layer, the active layer and the second DBR layer; and a conductive layer formed over the insulating layer and in contact with a portion of the second DBR layer, a portion of the insulating layer being exposed via the conductive layer, wherein a first opening, which exposes the insulating layer and overlaps with the active layer when viewed in the first direction of the first DBR layer, is formed in the conductive layer, and the first opening extends and has an annular shape when viewed in the first direction, wherein the conductive layer comprises a bonding pad, wherein the conductive layer comprises a first recess located between the first opening and the bonding pad, and wherein an additional opening, which exposes the insulating layer and overlaps with the active layer when viewed in the first direction of the first DBR layer, is formed in the conductive layer, and the additional opening has an annular shape and is connected to the first opening.

17. The surface emitting laser element of claim 16, wherein the second DBR layer comprises a DBR layer surface that is located on an opposite side from where the first DBR layer is located, and wherein an additional recess is recessed from the DBR layer surface and is arranged inside the first opening when viewed in the first direction.

* * * * *